United States Patent
Li

(10) Patent No.: US 11,363,700 B2
(45) Date of Patent: Jun. 14, 2022

(54) INTELLIGENT CONTROL SYSTEM FOR TOUCH SWITCH BASED ON INFRARED SENSOR DETECTION

(71) Applicant: ANHUI DJX INFORMATION TECHNOLOGY CO., LTD., Anhui (CN)

(72) Inventor: Longyun Li, Anhui (CN)

(73) Assignee: ANHUI DJX INFORMATION TECHNOLOGY CO., LTD., Anhui (CN)

( * ) Notice: Subject to any disclaimer, the term of this patent is extended or adjusted under 35 U.S.C. 154(b) by 838 days.

(21) Appl. No.: 16/309,914

(22) PCT Filed: Oct. 31, 2018

(86) PCT No.: PCT/CN2018/112987
§ 371 (c)(1),
(2) Date: Dec. 13, 2018

(87) PCT Pub. No.: WO2020/062402
PCT Pub. Date: Apr. 2, 2020

(65) Prior Publication Data
US 2021/0204382 A1 Jul. 1, 2021

(30) Foreign Application Priority Data
Sep. 29, 2018 (CN) .......................... 201811147756.3

(51) Int. Cl.
*H05B 47/13* (2020.01)
*G01J 3/10* (2006.01)
(Continued)

(52) U.S. Cl.
CPC .............. *H05B 47/13* (2020.01); *G01J 3/108* (2013.01); *G05B 15/02* (2013.01);
(Continued)

(58) Field of Classification Search
CPC ...... H05B 45/13; H05B 45/17; H05B 45/115; G06F 3/0487; G06F 3/04182; H03K 17/96; H03K 17/945
See application file for complete search history.

(56) References Cited

U.S. PATENT DOCUMENTS 10,635,210 B2* 4/2020 Yi ........................ G06F 3/04184
2010/0060611 A1* 3/2010 Nie ........................ G06F 3/0421
345/175

(Continued)

*Primary Examiner* — Tung X Le
(74) *Attorney, Agent, or Firm* — JCIPRNET

(57) ABSTRACT

The present application provides an intelligent control system for touch switch based on infrared sensor detection, which comprises: a position determination module, for setting infrared sensors in the first position, the second position, the third position, and the fourth position respectively, which are used to detect whether a person passes the current position; a time statistics module, for calculating the total time consumed by the target person passing through the first position, the second position, and the third position based on the detection result of those infrared sensors; a time determination module, for calculating the target time consumed by the target person passing from the third position to the fourth position; an intelligent control module, for selecting whether to turn on the light guide line from the fourth position to the position of the touch switch.

8 Claims, 1 Drawing Sheet

(51) Int. Cl.
  *G05B 15/02*   (2006.01)
  *H01H 13/02*   (2006.01)
  *H03K 17/945*  (2006.01)
  *H03K 17/96*   (2006.01)
  *H05B 47/00*   (2020.01)
  *H05B 47/115*  (2020.01)
  *H05B 47/16*   (2020.01)

(52) U.S. Cl.
  CPC ......... *H01H 13/023* (2013.01); *H03K 17/945* (2013.01); *H03K 17/96* (2013.01); *H05B 47/00* (2020.01); *H05B 47/115* (2020.01); *H05B 47/16* (2020.01); *G05B 2219/2642* (2013.01)

(56) References Cited

U.S. PATENT DOCUMENTS

| | | | |
|---|---|---|---|
| 2015/0049056 A1* | 2/2015 | Post | G06F 3/041 |
| | | | 345/174 |
| 2017/0068358 A1* | 3/2017 | Makiuchi | G06F 3/045 |
| 2019/0310755 A1* | 10/2019 | Sasaki | G06F 3/041 |
| 2021/0124481 A1* | 4/2021 | Taneko | G06F 3/04142 |

\* cited by examiner

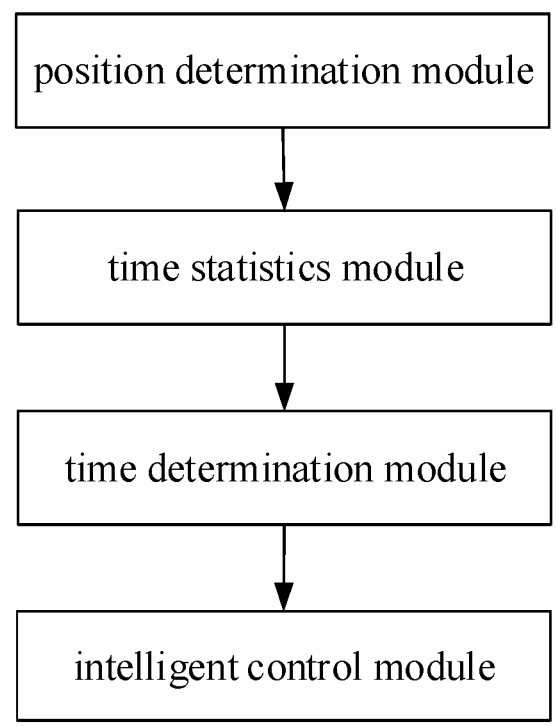

INTELLIGENT CONTROL SYSTEM FOR TOUCH SWITCH BASED ON INFRARED SENSOR DETECTION

CROSS-REFERENCE TO RELATED APPLICATION

This application is a 371 application of the international PCT application serial no. PCT/CN2018/112987, filed on Oct. 31, 2018, which claims the priority benefit of China application no. 201811147756.3, filed on Sep. 29, 2018. The entirety of each of the above-mentioned patent applications is hereby incorporated by reference herein and made a part of this specification.

TECHNICAL FIELD

The present application relates to the technical field of smart home control systems, and more particularly to an intelligent control system for touch switch based on infrared sensor detection.

BACKGROUND OF THE INVENTION

Smart home is based on residential platform, which utilizes the integrated wiring technology, network communication technology, security technology, automatic control technology, audio and video technology to integrate home-related facilities, and builds an efficient management system for residential facilities and family schedules, which improves the home safety, convenience, comfort, and artistry, and achieves an environmentally friendly and energy-saving living environment. Touch delay lights are mostly equipped with touch switches with metal sheets, however, when the ambient light is poor, the user cannot accurately determine the actual position of the touch switch, which not only causes trouble for users, affecting the user's comfort, but also easily leads to unsafe conditions such as user bumping, resulting in certain security risks.

SUMMARY OF THE INVENTION

Based on the technical problems existing in the background art, the present application provides an intelligent control system for touch switch based on infrared sensor detection.

The present application provides an intelligent control system for touch switch based on infrared sensor detection, which comprises;

a position determination module, configured for setting infrared sensors in a first position, a second position, a third position, and a fourth position respectively, wherein the infrared sensors are used to detect whether a person passes the current position;

a time statistics module, configured for calculating a total time consumed by a target person passing through the first position, the second position, and the third position in sequence, based on detection results of the infrared sensors in the first position, the second position, and the third position;

a time determination module, configured for acquiring a target time consumed by the target person passing from the third position to the fourth position, based on the detection results of the infrared sensors in the third position and the fourth position;

an intelligent control module, configured for selecting whether to turn on a light guide line from the fourth position to a position of the touch switch based on an analysis result of the total time and the target time.

Preferably, distances between the first position, the second position, the third position, the fourth position and the position of the touch switch are sequentially reduced.

Preferably, the time statistics module is specifically configured for:

recording the current time $t_1$, when the infrared sensor in the first position detects that the person passes the first position;

recording the time $t_2$ of the person passing the third position, when the infrared sensors in the second position and the third position detect that the person sequentially passes through the second position and the third position;

calculating a time difference t based on $t_1$ and $t_2$, wherein $t = t_2 - t_1$;

taking the time difference t as a total time consumed by the target person passing through the first position, the second position, and the third position in sequence.

Preferably, the time determination module is specifically configured for:

recording the current time $t_3$, when the infrared sensor in the third position detects that the person passes the third position;

recording the current time $t_4$, when the infrared sensor in the fourth position detects that the person passes the fourth position;

calculating a time difference to based on $t_3$ and $t_4$, wherein $t_0 = t_4 - t_3$;

taking the time difference $t_0$ as a total time consumed by the target person passing from the third position to the fourth position.

Preferably, a first preset time $t_{11}$ and a second preset time $t_{22}$ are stored in the intelligent control module;

the intelligent control module is specifically configured for:

acquiring the total time t consumed by the target person passing through the first position, the second position, and the third position in sequence;

comparing the total time t with the first preset time $t_{11}$:

when $t \leq t_{11}$, select to turn on the light guide line from the fourth position to the position of the touch switch;

when $t > t_{11}$, acquire the total time $t_0$ consumed by the target person passing from the third position to the fourth position;

comparing the total time to with the second preset time $t_{22}$:

when $t_0 \leq t_{22}$, select to turn on the light guide line from the fourth position to the position of the touch switch;

when $t_0 > t_{22}$, select not to turn on the light guide line from the fourth position to the position of the touch switch.

Preferably, a third preset time $t_{33}$ is stored in the intelligent control module;

the intelligent control module is also configured for:

recording the time $t_5$ of the person passing the third position and the time $t_6$ of the person passing the fourth position respectively, when the infrared sensors in the first position, the second position, and the third position do not detect that a person passes through the first position, the second position, and the third position, and the infrared sensors in the third position and the fourth position detect that a person passes through the third position and the fourth position in sequence;

calculating a time difference too based on $t_5$ and $t_6$, wherein $t_{00} = t_6 - t_5$;

comparing the time difference $t_{00}$ with the third preset time $t_{33}$;

when $t_{00} \leq t_{33}$, select to turn on the light guide line from the fourth position to the position of the touch switch;

when $t_{00} > t_{33}$, select not to turn on the light guide line from the fourth position to the position of the touch switch.

Preferably, a plurality of infrared sensors is respectively set on the first position, the second position, the third position, and the fourth position.

Preferably, in the light guide line, a plurality of LED lights is arranged at intervals.

The intelligent control system for touch switch based on infrared sensor detection proposed by the present application, determines whether a person passes through a plurality of different positions by setting infrared sensors at the plurality of different positions, so as to analyze whether the movement direction of the person is directed to the touch switch, and select whether to turn on the light guide line according to the analysis result, in order to guide the person on the walking line to the touch switch when the ambient light is poor, on the one hand, helping the person find the touch switches quickly and accurately, which optimize a user's usage, on the other hand, effectively protecting the user's security to prevent abnormal situations from occurring.

The present application firstly improves the validity of the analysis result prevents misjudgment, by analyzing whether the user continuously passes through the first position, the second position, and the third position to determine whether the user leads to the position of the touch switch, and analyzing the total time consumed by the user passes through the three positions. Furthermore, when the total time consumed by the user passing through the three positions exceeds the preset time, analyzes the target time consumed by the user passing through the third position and the fourth position, which prevents the system from accurately determining whether the user leads to the position of the touch switch when the user spends more time passing through the first position, the second position, and the third position, thereby improving the effectiveness of the system in use. Furthermore, the present application also adopts another method for analyzing whether the user leads to the position of the touch switch, that is, analyzing the relationship between the time consumed by the user passing from the third position to the fourth position and the preset time, to accommodate the judgment of the user's movement from different positions to the touch switch, which improves the effectiveness and accuracy of the control results of the system on the basis of expanding the application scope of the system.

BRIEF DESCRIPTION OF DRAWING

FIG. 1 is a schematic diagram of an intelligent control system for touch switch based on infrared sensor detection.

DETAILED DESCRIPTION OF THE INVENTION

As shown in FIG. 1, FIG. 1 is a schematic diagram of an intelligent control system for touch switch based on infrared sensor detection according to the present application.

Referring to FIG. 1, the present application provides an intelligent control system for touch switch based on infrared sensor detection, which comprises:

A position determination module, configured for setting infrared sensors in a first position, a second position, a third position, and a fourth position, respectively, wherein the infrared sensor is used to detect whether a person passes the current position.

In an embodiment of the present application, in order to improve the effectiveness of the detection process and the control result, the distances between the first position, the second position, the third position, the fourth position and the position of the touch switch is sequentially reduced, which ensures the accuracy of the analysis results by position analysis.

Further, a plurality of infrared sensors is respectively set on the first position, the second position, the third position, and the fourth position, which are used to detect more comprehensively and effectively whether a person passes each position.

A time statistics module, configured for calculating the total time consumed by a target person passing through the first position, the second position, and the third position in sequence, based on the detection result of those infrared sensors in the first position, the second position, and the third position.

In an embodiment of the present application, the time statistics module is specifically configured for:

recording the current time $t_1$, when the infrared sensor in the first position detects that a person passes the first position;

recording the time $t_2$ of the person passing the third position, when those infrared sensors in the second position and the third position detect that a person sequentially passes through the second position and the third position;

calculating the time difference t based on $t_1$ and $t_2$, wherein $t = t_2 - t_1$;

taking the time difference t as the total time consumed by the target person passing through the first position, the second position, and the third position in sequence.

A time determination module, configured for acquiring the target time consumed by the target person passing from the third position to the fourth position, based on the detection results of those infrared sensors in the third position and the fourth position.

In an embodiment of the present application, the time determination module is specifically configured for:

recording the current time $t_3$, when the infrared sensor in the third position detects that a person passes the third position;

recording the current time $t_4$, when the infrared sensor in the fourth position detects that a person passes the fourth position;

calculating the time difference to based on $t_3$ and $t_4$, wherein to $= t_4 - t_3$;

taking the time difference to as the total time consumed by the target person passing from the third position to the fourth position.

An intelligent control module, configured for selecting whether to turn on the light guide line from the fourth position to the position of the touch switch based on the analysis result of the above-mentioned total time and the above-mentioned target time.

In an embodiment of the present application, a first preset time $t_{11}$ and a second preset time $t_{22}$ are stored in the intelligent control module.

The intelligent control module is specifically configured for:

acquiring the total time t consumed by the target person passing through the first position, the second position, and the third position in sequence;

comparing the total time t with the first preset time $t_{11}$:

when $t \leq t_{11}$, which indicates that the target person spends less time passing from the first position to the third position, that is, the target person is more likely to lead to the position of the touch switch, then select to turn on the light guide line from the fourth position to the position of the touch switch, to guide the target person to reach the position of the touch switch quickly, accurately and safely;

when $t > t_{11}$, which indicates that the target person spends more time passing from the first position to the third position, acquiring the total time $t_0$ consumed by the target person passing from the third position to the fourth position, to further and accurately analyze the movements of the target person;

comparing the total time to with the second preset time $t_{22}$:

when $t_0 \leq t_{22}$, which indicates that the target person spends less time passing from the third position to the fourth position, and the target person is more likely to lead to the position of the touch switch, then select to turn on the light guide line from the fourth position to the position of the touch switch, to provide an accurate and safe line guidance for the target person;

when $t_0 > t_{22}$, which indicates that the target person passes slowly from the third position to the fourth position, that is, the target person is less likely to lead to the position of the touch switch, then select not to turn on the light guide line from the fourth position to the position of the touch switch.

In a further embodiment, a third preset time $t_{33}$ is stored in the intelligent control module.

The intelligent control module is also configured for:

recording the time $t_5$ of the person passing the third position and the time $t_6$ of the person passing the fourth position respectively, when the infrared sensors in the first position, the second position, and the third position do not detect that a person passes through the first position, the second position, and the third position, and the infrared sensors in the third position and the fourth position detect that a person passes through the third position and the fourth position in sequence;

calculating the time difference too based on $t_5$ and $t_6$, wherein $t_{00} = t_6 - t_5$;

comparing the time difference $t_{00}$ with the third preset time $t_{33}$;

when $t_{00} \leq t_{33}$, which indicates that the target person spends less time passing from the third position to the fourth position, the target person is more likely to lead to the position of the touch switch, select to turn on the light guide line from the fourth position to the position of the touch switch, to provide an accurate and safe line guidance for the target person;

when $t_{00} > t_{33}$, which indicates that the target person passes slowly from the third position to the fourth position, select not to turn on the light guide line from the fourth position to the position of the touch switch, to avoid wasting energy.

In an embodiment of the present application, in the light guide line, a plurality of LED lights is arranged at intervals, which on the one hand, improves the lighting effect, and on the other hand, saves the electric energy effectively.

The intelligent control system for touch switch based on infrared sensor detection proposed by the embodiment, determines whether a person passes through a plurality of different positions by setting infrared sensors at the plurality of different positions, so as to analyze whether the movement direction of the person is directed to the touch switch, and select whether to turn on the light guide line according to the analysis result, in order to guide the person on the walking line to the touch switch when the ambient light is poor, on the one hand, helping the person find the touch switches quickly and accurately, which optimize a user's usage, on the other hand, effectively protecting the user's security to prevent abnormal situations from occurring.

The present application firstly improves the validity of the analysis result prevents misjudgment, by analyzing whether the user continuously passes through the first position, the second position, and the third position to determine whether the user leads to the position of the touch switch, and analyzing the total time consumed by the user passes through the three positions; further, when the total time consumed by the user passing through the three positions exceeds the preset time, analyzes the target time consumed by the user passing through the third position and the fourth position, which prevents the system from accurately determining whether the user leads to the position of the touch switch when the user spends more time passing through the first position, the second position, and the third position, thereby improving the effectiveness of the system in use; furthermore, the present application also adopts another method for analyzing whether the user leads to the position of the touch switch, that is, analyzing the relationship between the time consumed by the user passing from the third position to the fourth position and the preset time, to accommodate the judgment of the user's movement from different positions to the touch switch, which improves the effectiveness and accuracy of the control results of the system on the basis of expanding the application scope of the system.

The above is only the preferred embodiment of the present application, but the scope of protection of the present application is not limited thereto, and any equivalents or modifications of the technical solutions of the present application and the application concept thereof should be included in the scope of the present application within the scope of the technical scope of the present application.

The invention claimed is:

1. An intelligent control system for touch switch based on infrared sensor detection, comprising:

a position determination module, configured for setting infrared sensors in a first position, a second position, a third position, and a fourth position respectively, wherein the infrared sensors are used to detect whether a target person passes a current position;

a time statistics module, configured for calculating a total time consumed by the target person passing through the first position, the second position, and the third position in sequence, based on detection results of the infrared sensors in the first position, the second position, and the third position;

a time determination module, configured for acquiring a target time consumed by the target person passing from the third position to the fourth position, based on the detection results of the infrared sensors in the third position and the fourth position; and an intelligent control module, configured for selecting whether to turn on a light guide line from the fourth position to a fifth position of the touch switch based on an analysis result of the total time and the target time.

2. The intelligent control system for touch switch based on infrared sensor detection according to claim 1, wherein distances between the first position, the second position, the third position, the fourth position and the fifth position of the touch switch are sequentially reduced.

3. The intelligent control system for touch switch based on infrared sensor detection according to claim 1, wherein the time statistics module is specifically configured for:

recording a first current time $t_1$, when the infrared sensor in the first position detects that the target person passes the first position;

recording a second time $t_2$ of the target person passing the third position, when those infrared sensors in the second position and the third position detect that the target person sequentially passes through the second position and the third position;

calculating a first time difference t based on the first time $t_1$ and the second time $t_2$, wherein $t=t_2-t_1$; and taking the first time difference t as a total time consumed by the target person passing through the first position, the second position, and the third position in sequence.

4. The intelligent control system for touch switch based on infrared sensor detection according to claim 3, wherein the time determination module is specifically configured for:

recording a third time $t_3$, when the infrared sensor in the third position detects that the target person passes the third position;

recording a fourth time $t_4$, when the infrared sensor in the fourth position detects that the target person passes the fourth position;

calculating a second time difference to based on the third time $t_3$ and the fourth time $t_4$, wherein $t_0=t_4-t_3$; and taking the second time difference $t_0$ as a total time consumed by the target person passing from the third position to the fourth position.

5. The intelligent control system for touch switch based on infrared sensor detection according to claim 4, wherein a first preset time $t_{11}$ and a second preset time $t_{22}$ are stored in the intelligent control module;

the intelligent control module is specifically configured for:

acquiring the total time t consumed by the target person passing through the first position, the second position, and the third position in sequence;

comparing the total time t with the first preset time $t_{11}$:

when $t \leq t_{11}$, select to turn on the light guide line from the fourth position to the fifth position of the touch switch;

when $t > t_{11}$, acquire the total time to consumed by the target person passing from the third position to the fourth position;

comparing the total time to with the second preset time $t_{22}$:

when $t_0 \leq t_{22}$, select to turn on the light guide line from the fourth position to the fifth position of the touch switch;

when $t_0 > t_{22}$, select not to turn on the light guide line from the fourth position to the fifth position of the touch switch.

6. The intelligent control system for touch switch based on infrared sensor detection according to claim 4, wherein a third preset time $t_{33}$ is stored in the intelligent control module;

the intelligent control module is also configured for:

recording a fifth time $t_5$ of the target person passing the third position and a sixth time $t_6$ of the target person passing the fourth position respectively, when the infrared sensors in the first position, the second position, and the third position do not detect that a person passes through the first position, the second position, and the third position, and the infrared sensors in the third position and the fourth position detect that the target person passes through the third position and the fourth position in sequence;

calculating a third time difference too based on the fifth time $t_5$ and the sixth time $t_6$, wherein $t_{00}=t_6-t_5$;

comparing the third time difference $t_{00}$ with the third preset time $t_{33}$;

when $t_{00} \leq t_{33}$, select to turn on the light guide line from the fourth position to the fifth position of the touch switch;

when $t_{00} > t_{33}$, select not to turn on the light guide line from the fourth position to the fifth position of the touch switch.

7. The intelligent control system for touch switch based on infrared sensor detection according to claim 1, wherein a plurality of infrared sensors is respectively set on the first position, the second position, the third position, and the fourth position.

8. The intelligent control system for touch switch based on infrared sensor detection according to claim 1, wherein in the light guide line, a plurality of LED lights is arranged at intervals.

* * * * *